(12) United States Patent
Ebergen

(10) Patent No.: US 6,700,410 B2
(45) Date of Patent: *Mar. 2, 2004

(54) METHOD AND APPARATUS FOR ASYNCHRONOUSLY CONTROLLING A HIGH-CAPACITY DOMINO PIPELINE

(75) Inventor: Jo Ebergen, San Francisco, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/200,830

(22) Filed: Jul. 23, 2002

(65) Prior Publication Data

US 2003/0201797 A1 Oct. 30, 2003

Related U.S. Application Data

(63) Continuation-in-part of application No. 10/135,166, filed on Apr. 29, 2002.

(51) Int. Cl.[7] .............................................. H03K 19/00
(52) U.S. Cl. .............................. 326/93; 326/82; 326/95; 326/112
(58) Field of Search ............................. 326/93, 95, 98, 326/82, 83, 112, 119, 121

(56) References Cited

U.S. PATENT DOCUMENTS 6,356,117 B1 * 3/2002 Sutherland et al. ............ 326/93
6,590,424 B2 * 7/2003 Singh et al. ................... 326/93

OTHER PUBLICATIONS

Publication entitled "Fine–Grain Pipelined Asynchronous Adders for High–Speed DSP Applications," by Montek Singh et al., IEEE Computer Society Annual Workshop on VLSI, Apr. 27–28, 2000, Orlando, Florida.

Publication entitled "An Adaptively–Pipelined Mixed Synchronous–Asynchronous Digital FIR Filter Chip Operating at 1.3 GigaHertz," by Montek Singh et al., Proceedings of IEEE ASYNC 2002, pp. 84–95.

* cited by examiner

Primary Examiner—Daniel Chang
(74) Attorney, Agent, or Firm—Park, Vaughan & Fleming LLP

(57) ABSTRACT

One embodiment of the present invention provides a domino logic circuit that operates asynchronously. This domino logic circuit contains a pipeline comprised of a number of stages of domino logic, including a present stage that receives one or more inputs from a prior stage and that generates one or more outputs for a next stage. The present stage includes a control circuit that is configured to ensure that the present stage enters a precharging state before entering an evaluation state—in which one or more inputs of the present stage are used to generate one or more outputs. This control circuit operates by receiving a prior control signal from the prior stage and sending a present control signal to the next stage. During this process, the control circuit ensures that a minimum cycle time between successive evaluation states is six gate delays.

21 Claims, 8 Drawing Sheets

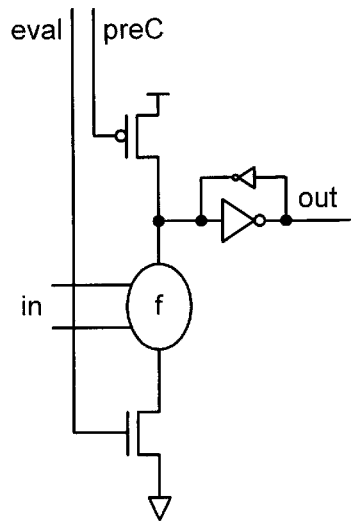
```
EVAL =  eval AND  preC
HOLD = ~eval AND  preC
PRE  = ~eval AND ~preC
The state (eval AND ~preC) is disallowed
```
FIG. 2B
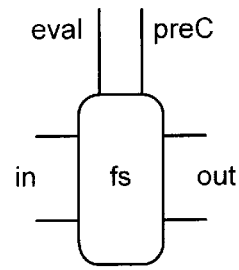
FIG. 2A
FIG. 2C
$$S0 = (e0 \rightarrow e1 \rightarrow p0 \rightarrow S0)$$
FIG. 3A
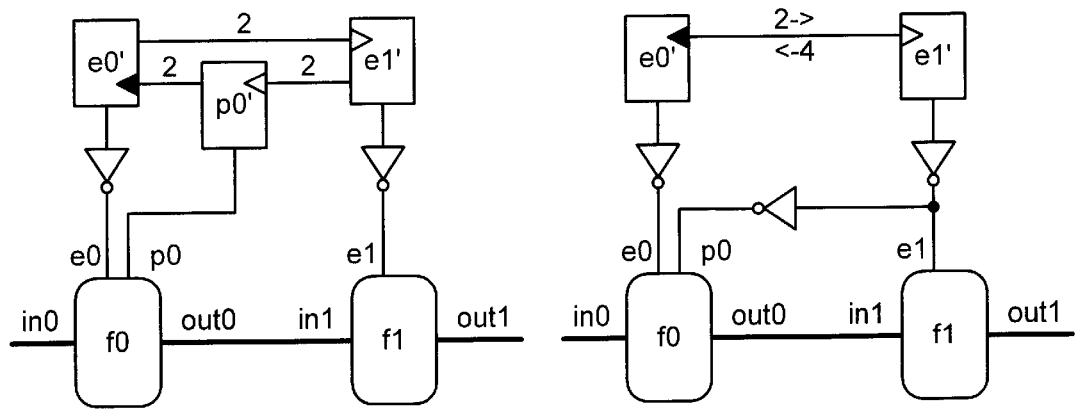
FIG. 3B  FIG. 3C

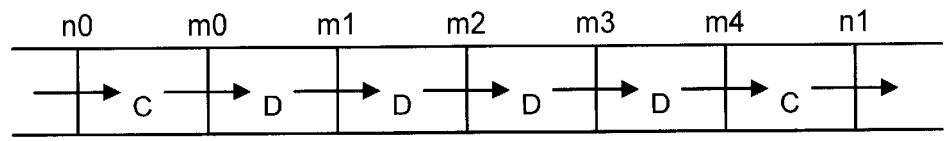
FIG. 6A
```
C0 & S0 & S1 & S2 & C1
where
    C0 = (n0 -> m0 -> C0)
    S0 = (m0 -> m1 -> m2 -> S0)
    S1 = (m1 -> m2 -> m3 -> S1)
    S2 = (m2 -> m3 -> m4 -> S2)
    C1 = (m4 -> n1 -> C1)
end
```
FIG. 6B
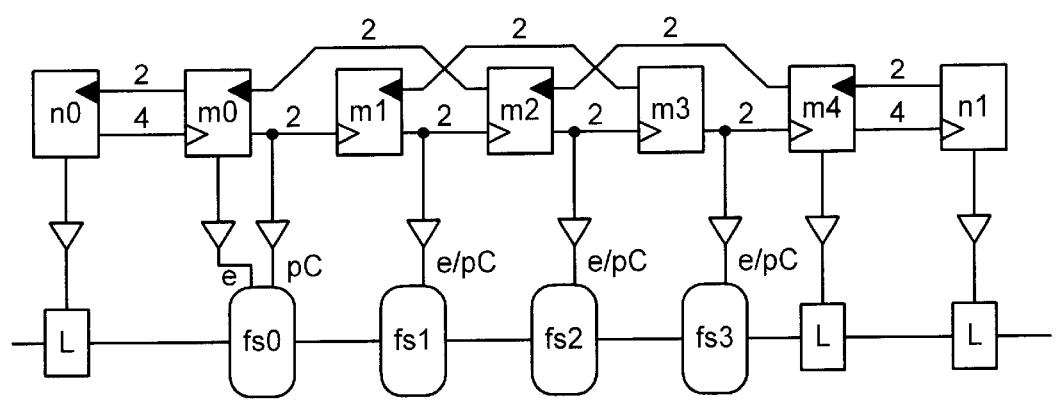
FIG. 6C

METHOD AND APPARATUS FOR ASYNCHRONOUSLY CONTROLLING A HIGH-CAPACITY DOMINO PIPELINE

RELATED APPLICATION

This application is a continuation-in-part of, and hereby claims priority under 35 U.S.C. §120 to U.S. patent application Ser. No. 10/135,166 filed on Apr. 29, 2002 is still pending by inventors Jo Ebergen, Ivan E. Sutherland, Jon Lexau and Jonathan Gainsley, entitled, "Method and Apparatus for Asynchronously Controlling Domino Logic Gates".

BACKGROUND

1. Field of the Invention

The present invention relates to the design of digital circuits that operate asynchronously. More specifically, the present invention relates to a method and an apparatus for asynchronously controlling a high-capacity domino pipeline in a manner that maximizes throughput.

2. Related Art

Domino logic circuits are becoming increasingly popular because they provide reduced input capacitance and low switching thresholds, which result in increased speed. Moreover, the use of domino logic leads to simple, area-efficient circuit layouts, which save space on a semiconductor die.

Referring to FIG. 1A, a domino logic circuit operates by first entering a precharging state that precharges an interior node 105 to a high voltage. This precharging operation is accomplished by using P-type transistor 107 to pull interior node 105 to a high voltage. Note that this precharging operation sets the output 106 of inverter 103 to a low voltage. During a subsequent evaluation state, interior node 105 either switches from the high voltage to a low voltage, or remains at the high voltage depending upon the inputs 102 and 104 and the function implemented by transistors in functional circuitry 112.

When interior node 105 falls during the evaluation state, it causes the output 106 of inverter 103 to change, which can cause outputs of a chain of downstream domino logic stages to change in much the same way as a chain of dominos falls.

In a synchronous system, it is a relatively simple matter to synchronize the precharging and evaluation operations with different phases of a system clock signal. However, in an asynchronous system, which does not operate with reference to a system clock, coordinating the precharging and evaluation operations can be considerably more challenging.

In spite of the fact that asynchronous circuits present a number of design challenges, asynchronous circuits are free from having to continually synchronize with a system clock signal. This allows asynchronous circuits to run at significantly higher speeds.

Singh and Nowick describe an asynchronous control circuit for a high-capacity domino pipeline that can accommodate one data item per pipeline stage (see "Fine-Grain Pipelined Asynchronous Address for High-Speed DSP Applications," Proceedings of the IEEE Computer Society Annual Workshop on VLSI, Apr. 27–28, 2000 Orlando, Fla.). This asynchronous control circuit has a minimum cycle time between successive evaluation operations of at least eight gate delays, which is not optimal. Moreover, the control circuit described by Singh and Nowick consumes a large amount of energy.

What is needed is a method and an apparatus for asynchronously controlling a domino logic pipeline with a faster cycle time and lower energy consumption than the circuit described by Singh and Nowick.

SUMMARY

One embodiment of the present invention provides a domino logic circuit that operates asynchronously. This domino logic circuit contains a pipeline comprised of a number of stages of domino logic, including a present stage that receives one or more inputs from a prior stage and that generates one or more outputs for a next stage. The present stage includes a control circuit that is configured to ensure that the present stage enters a precharging state before entering an evaluation—in which one or more inputs of the present stage are used to generate one or more outputs. This control circuit operates by receiving a prior control signal from the prior stage and sending a present control signal to the next stage. During this process, the control circuit ensures that a minimum cycle time between successive evaluation states is six gate delays.

In a variation on this embodiment, upon receiving the prior control signal from the prior stage indicating that the prior stage is in the evaluation state, the control circuit for the present stage causes domino logic within the present stage to enter the evaluation state, so that the domino logic within the present stage evaluates at least one input received from the prior stage to produce at least one output for the next stage. The control circuit also causes the domino logic within the prior stage to return to the precharging state. This allows the domino logic within the prior stage to precharge before entering a subsequent evaluation state.

In a variation on this embodiment, the control circuit for the present stage includes a GasP module. This GasP module fires when all of its inputs are set. This firing causes all outputs of the GasP module to be set and causes all inputs to the GasP module to be reset. (The design of a GasP module is described in more detail below with reference to FIGS. 7–9.)

In a variation on this embodiment, the control circuit for the present stage feeds an evaluation signal into domino logic in the present stage, which causes the domino logic in the present stage to enter the evaluation state. The control circuit for the present stage also feeds a precharging signal into the present stage, which causes the domino logic in the present stage to enter the precharging state. If the evaluation signal and the precharging signal are not asserted, the domino logic in the present stage enters a hold state in which the outputs of the domino logic do not change.

In a further variation, the control circuit for the present stage includes a first GasP module that generates the evaluation signal for the present stage, and a second GasP module that generates the precharging signal for the present stage. In this variation, the first GasP module receives an input from the second GasP module and an input from the control circuit for the prior stage. Furthermore, the second GasP module receives an input from the control circuit for the next stage.

In a further variation, the control circuit for the present stage includes a GasP module that generates the evaluation signal for the present stage. In this variation, the precharging signal for the present stage is generated from the evaluation signal for the next stage.

In a variation on this embodiment, the present stage includes a keeper circuit that maintains an existing value on an output of the present stage.

In a variation on this embodiment, the domino logic for the present stage includes a pulldown transistor for pulling an internal node of the present stage to a low voltage during the evaluation state. It also includes a pullup transistor for pulling the internal node of the present stage to a precharge voltage during the precharging state.

BRIEF DESCRIPTION OF THE FIGURES

FIG. 2A illustrates a three-state domino logic gate in accordance with an embodiment of the present invention.

FIG. 2B defines the states for the three-state domino logic gate illustrated in FIG. 2A in accordance with an embodiment of the present invention.

FIG. 2C presents the symbol for the three-state domino logic gate illustrated in FIG. 2A in accordance with an embodiment of the present invention.

FIG. 3A illustrates a specification of a domino pipeline stage in accordance with an embodiment of the present invention.

FIG. 3B illustrates a high-capacity domino pipeline with two GasP modules per stage in accordance with an embodiment of the present invention.

FIG. 3C illustrates a high-capacity domino pipeline with one GasP module per stage in accordance with an embodiment of the present invention.

FIG. 6A illustrates data movements between domino logic stages in accordance with another embodiment of the present invention.

FIG. 6B illustrates a specification for the data movements in accordance with another embodiment of the present invention.

FIG. 6C illustrates GasP circuitry for controlling the data movements in accordance with another embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1A:
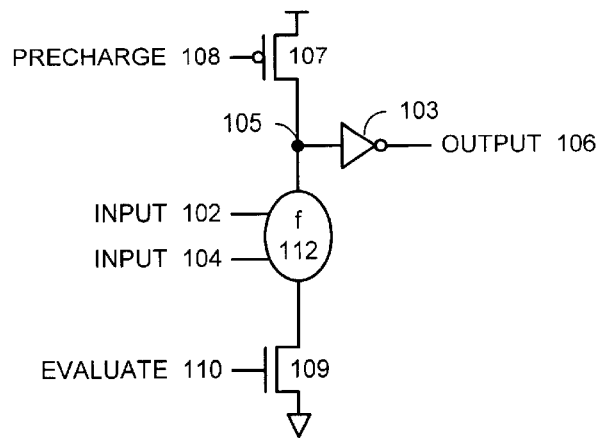
FIG. 1A illustrates a domino logic stage.
Figure 1B:
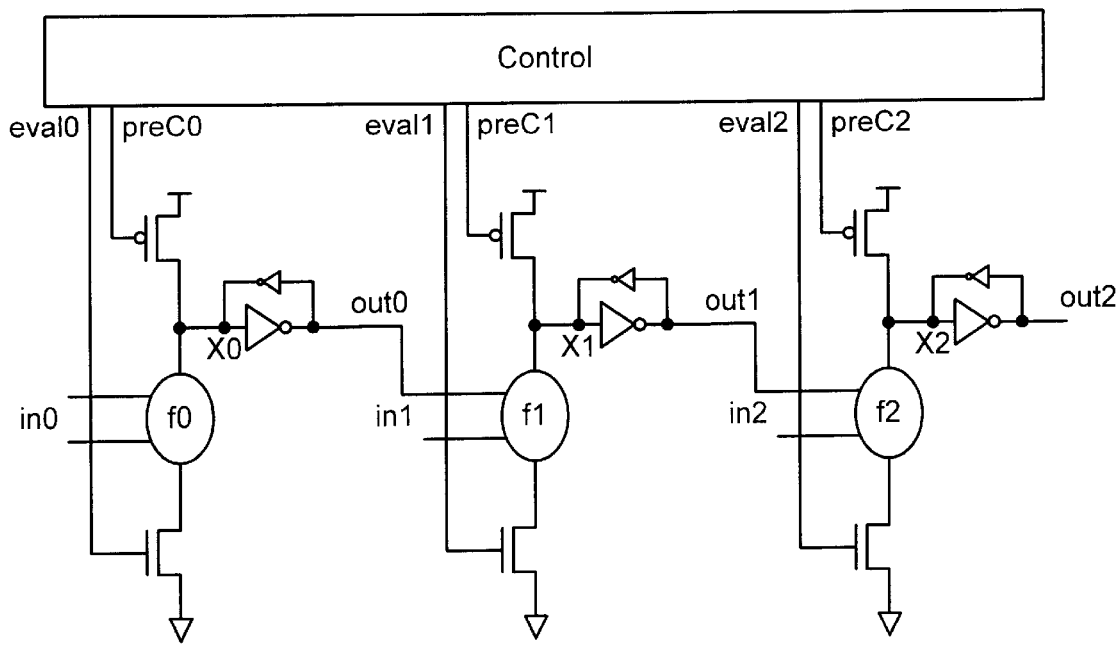
FIG. 1B illustrates a series of domino logic stages in accordance with an embodiment of the present invention.

Consider the pipeline of three-state domino gates illustrated in FIG. 1B. Each domino gate has a stack of pull-down transistors representing the function implemented by the domino gate, a pull-down transistor and a pull-up transistor coupled to the control wires eval and preC, and an inverter with weak feedback to hold the present value.

FIG. 2A shows a single three-state domino gate. The control wire labeled eval controls the footer NMOS pull-down transistor and the wire labeled preC controls the PMOS pull-up transistor. This domino gate is a three-state domino gate, because at any time the domino gate is in one of three states evaluate (EVAL), precharge (PRE), or hold (HOLD).

FIG. 2B defines the three states of the domino gate with respect to the state of the control wires eval and preC, where "~" denotes negation. In the state EVAL, only the pull-down NMOS transistor is conducting and the domino gate is evaluating the next output value. In the state PRE, only the pull-up PMOS transistor is conducting. In this state, the domino gate resets all internal nodes to HI and all output values to LO. In the state HOLD, neither the pull-down NMOS transistor nor the pull-up transistor are conducting. In this state, the domino gate "holds" the current value. The fourth state, where both the NMOS and PMOS transistor are conducting, is disallowed.

The idea is that the three-state domino gate cycles through the states HOLD, EVAL, HOLD, and PRE in that sequence, where the time the domino gate spends in the state HOLD may be zero, but the duration of states EVAL and PRE are non-zero. Initially, the domino gates are in the state HOLD with the internal nodes initialized to HI and the outputs initialized to LO.

FIG. 2C shows a symbol for a collection of three-state domino gates, where the eval and preC control wires are common to all gates. Connecting the wires eval and preC, creates a standard domino gate, which has only two states, namely EVAL and PRE. Separating the wires eval and preC, however, allows for a richer set of behaviors for the domino pipeline.

The problem is to design a control circuit for a pipeline of three-state domino gates such that the pipeline has a maximum capacity of one data item per stage. In doing so, we seek a design with a small cycle time and low energy consumption.

In this disclosure, we first derive a specification for the interactions of one stage with adjacent stages. Second, we map our specification for one stage onto a GasP implementation. Third, we present the complete design as the composition of the specifications for all the stages.

As for notational conventions, we define two actions for each stage: e for "start evaluating" and p for "start precharging." If we need to make a distinction between actions for different stages, we postfix each action with the respective stage number.

Our first requirement is that for each stage, evaluation and precharge should alternate. This requirement leads to specification R0 for stage 0.

$$R0 = (e0 \rightarrow p0 \rightarrow R0)$$

The second requirement is that for each stage the periods of evaluation and precharge have no overlap. If we choose a duration of three gate delays for both evaluation and precharge, then the time separations between the start of an evaluation and the start of a successive precharge must be at least three gate delays. This requirement leads to specification T0 with timing information.

$$T0 = (e0 \xrightarrow{3} p0 \xrightarrow{3} T0)$$

The numbers above the arrows denote the time separations between the respective actions. Note that specification T0 does not require that the time separations must be exactly three gate delays. The specification merely requires that the time separations are at least three gate delays.

The third requirement includes the interactions with adjacent stages. We choose to start evaluation of a stage when its data inputs become valid. Other design decisions are possible here. For example, a domino gate may start evaluation any time before its inputs become valid, thereby possibly speeding up the domino gate.

If stage 0 starts evaluation, two gate delays later the outputs of stage 0 are valid. Consequently, stage 1 may start evaluation two gate delays after stage 0 starts evaluation. Evaluation of stage 1 lasts three gate delays. During this period, the inputs to stage 1 must remain stable or change monotonically from LO to HI. In particular, any precharging of stage 0 must not affect the result of evaluation in stage 1. Because the inputs to stage 1 become invalid at the earliest two gate delays after precharge of stage 0 starts, stage 0 may start precharging one gate delay after stage 1 starts evaluation. Finally, at the end of a precharge of stage 0, stage 0 may start the next evaluation. These sequence requirements lead to our final specification so for stage 0.

$$S0 = (e0 \xrightarrow{2} e1 \xrightarrow{1} p0 \xrightarrow{3} S0)$$

Specification S0 and the associated timing guarantees that evaluation and precharging of the domino gate in stage 0 never overlap and that stage 1 may start evaluation as soon as its inputs become valid. A timing diagram for specification S0 appears in FIG. 4A. Specification so completes our first step for stage 0. Similar specifications, with an appropriate renaming, can be given to each of the other stages.

Figure 4A:
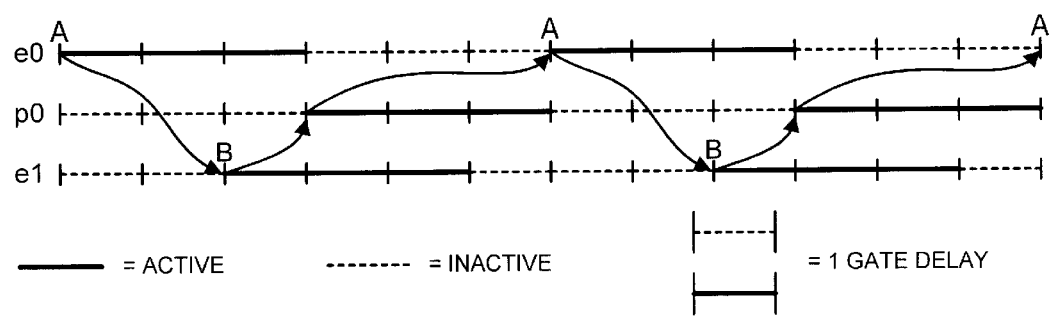
FIG. 4A presents a timing diagram for the two GasP modules per stage circuit illustrated in FIG. 3B in accordance with an embodiment of the present invention.
Figure 4B:
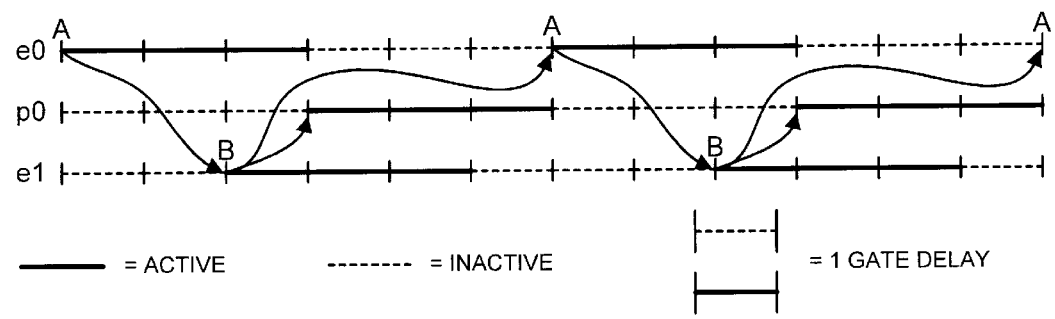
FIG. 4B presents a timing diagram for the two GasP modules per stage circuit illustrated in FIG. 3C in accordance with an embodiment of the present invention.

The points A and B in FIGS. 4A and 4B indicate synchronization points between neighboring stages. The actions at these points may be delayed, because one of the neighboring stages is not yet ready to perform an evaluation. If the action at a point A or B must wait, the state HOLD has a non-zero duration. Moreover, any subsequent actions will be delayed automatically as well.

A Solution: Implementation

The second step is the implementation of S0 by means of GasP modules. We want to use the pulse output of a GasP module for driving the evaluation or precharge signals. A problem in doing so is that the specification requires even and odd time separations, whereas the number of gate delays between firings of GasP modules are always even, unless we use both NAND and NOR GasP modules. For reasons of simplicity, however, we will stick to NAND GasP modules.

Fortunately, if we take the buffer delays and the polarity of the evaluate and precharge signals into account, we can implement the specified delays between the actions. FIG. 3A shows a specification S0 of the first stage. FIG. 3B shows an implementation in GasP modules of specification S0.

The GasP modules implement specification S0', where $$S0' = (e0' \rightarrow e1' \rightarrow p0' \rightarrow S0')$$

Each time separation between firings of successive GasP modules is two gate delays. The time separations between e0, e1 and p0 follow from the time separations between e0', e1' and p0' by adding or subtracting one buffer delay. For example, the time separation between e1 and p0 is only one gate delay, because of the absence of a buffer in the pulse output of GasP module p0'. Similarly, the time separation between p0 and e1 is three gate delays, because of the additional buffer delay in the pulse output of GasP module e0'.

Figure 5A:
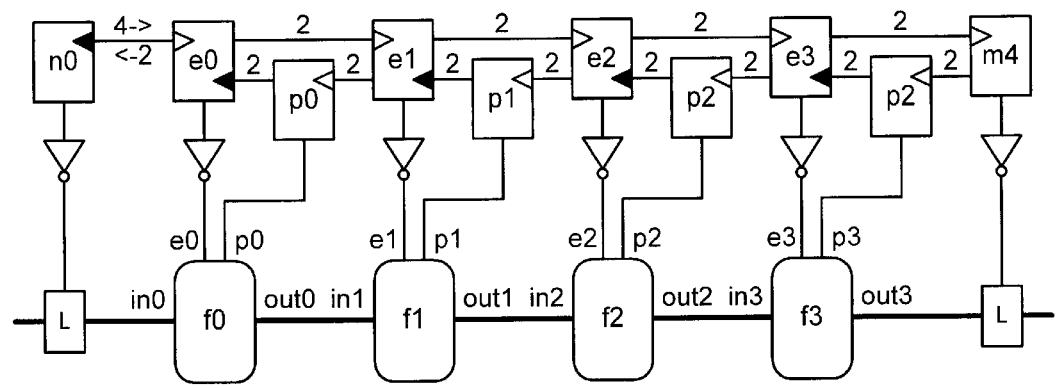
FIG. 5A illustrates a complete high-capacity domino pipeline with two GasP modules per stage in accordance with an embodiment of the present invention.

The third step is obtaining a complete implementation. A similar specification as specification S0 applies to stages 1, 2, 3, and so on. Taking the AND of these specifications gives the specification of a complete pipeline. FIG. 5A shows the AND of four domino stages in a pipeline and a stage with a standard latch at the beginning and end of the pipeline.

A Better Solution

The linear pipeline of FIG. 5A can be optimized. Notice that only the evaluation actions synchronize with actions from adjacent stages. The precharge action of each stage is not synchronized with any action of adjacent stages. Because a precharge action never has to wait, we can safely require that a precharge of a stage starts exactly one gate delay after each evaluation of the next stage starts and that the precharge action lasts three gate delays. Subsequently, we can take the precharge action out of the repetition by requiring that an evaluation of a stage starts at least four gate delays after each evaluation of the next stage. FIG. 4B illustrates this change in the sequence requirements.

This resulting sequence of actions may be implemented by the GasP network of FIG. 3C, where we assume that all gates have equal delay. Notice that this network of GasP modules has a single state wire between adjacent GasP modules. The forward latency for a stage is two gate delays, and the reverse latency is four gate delays. This is exactly the opposite of a GasP control for a "classic" pipeline with latches. Apart from the switch in forward and reverse latency, the GasP circuit of FIG. 3C has exactly the same properties as the GasP control for a classic pipeline with latches. These properties include a cycle time of six gate delays, where each gate delay can be very small, and an efficient energy consumption.

Figure 5B:
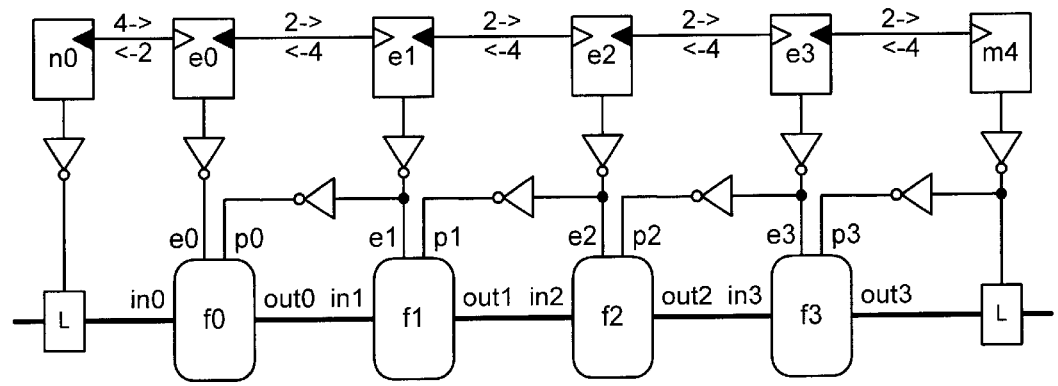
FIG. 5B illustrates a complete high-capacity domino pipeline with one GasP module per stage in accordance with an embodiment of the present invention.

FIG. 5B shows a complete implementation of a domino pipeline using the optimized GasP control. Like the implementation in FIG. 5A, the implementation of FIG. 5B starts with a GasP module controlling a standard latch and ends with a GasP module controlling a standard latch, thus illustrating that control circuits for data paths with latches and control circuits for domino data paths can be combined easily in both implementations.

For the sake of comparison, FIG. 6 illustrates a half-capacity pipeline with control circuits.

Concluding Remarks

Besides the difference in capacity of the half-capacity and high-capacity pipelines, let us look at some other differences between the two pipelines.

One difference is that control circuits for high-capacity pipelines are simpler. They comprise a simple connection between only two adjacent stages. The control circuits for the half-capacity pipelines comprise simple connections between three adjacent stages. The simpler GasP network for high-capacity pipelines offer good prospects for simpler control circuits for forking, joining, data-dependent branching, and data-dependent merging pipelines.

Another difference is that the control circuits for the high-capacity pipelines may be more immune to noise. Notice that the evaluation and precharge signals in the high-capacity pipelines are always driven either HI or LO by a GasP module. In the half-capacity pipelines, however, the evaluation/precharge signals come from the state wires. These signals are tri-state signals, which means that at any time either some GasP module drives an evaluation/precharge signal HI or LO, or no GasP module drives the evaluation/precharge signal. Tri-state wires may be more susceptible to noise than wires that are always driven either HI or LO.

Yet another difference is in the reverse latencies of the two pipelines. A half-capacity pipeline of 2n stages has a reverse latency of 2n/2*2=2n gate delays, whereas a full-capacity pipeline of 2n stages has a reverse latency of 2n*4=8n gate delays. The forward latencies of both pipelines, which is a more important figure of merit, is the same, however. Each pipeline with 2n stages has a forward latency of 2n*2=4n gate delays.

In order to implement high-capacity pipelines, it is important that the evaluate and precharge control wires of a domino gate are decoupled. Standard domino gates, where the evaluate and precharge wire are the same wire, cannot implement high-capacity pipelines. Notice that when all stages are full in a high-capacity pipeline, all domino gates are in the HOLD state, that is, the domino gate is neither evaluating nor precharging. Standard domino gates cannot exhibit such a HOLD state.

Note that the operation of the domino pipeline relies on the satisfaction of a number of delay assumptions in the control circuit and in the domino data path. In particular, the gate delays in the control circuits are ideally equal and these gate delays should be at least the gate delays in the data path, both during evaluation and precharging. With proper transistor sizing these delay assumptions can be satisfied. Notice that most delay assumptions are local delay assumptions.

Also note that like Singh and Nowick's design discussed above in the Summary section, our control circuit has a maximum capacity of one data item per stage. However, unlike Singh and Nowick's control circuit, our GasP control circuit has a minimum cycle time of six gate delays. Moreover, our control circuit has advantages over Singh and Nowick's circuit in terms of energy consumption.

GasP Modules

We denote a GasP module by means of a rectangular box with a label inside and a series of connections. The label denotes the event that is associated with the GasP module. Each GasP module can have three different types of connections. FIGS. 7 and 8 give the three types of connections of a GasP module together with their 2–4 GasP implementations. FIG. 7 shows the symbols and their implementations for connections between GasP modules where the time separation between the "firings" of two modules is two gate delays. FIG. 8 shows the symbols and their implementations for connections between GasP modules where the time separation between the "firings" of two modules is four gate delays. Both figures show connections attached to the left and the right of a GasP module. Apart from a reflection, the implementations of the left-side and right-side connections are the same.

Figure 7A:
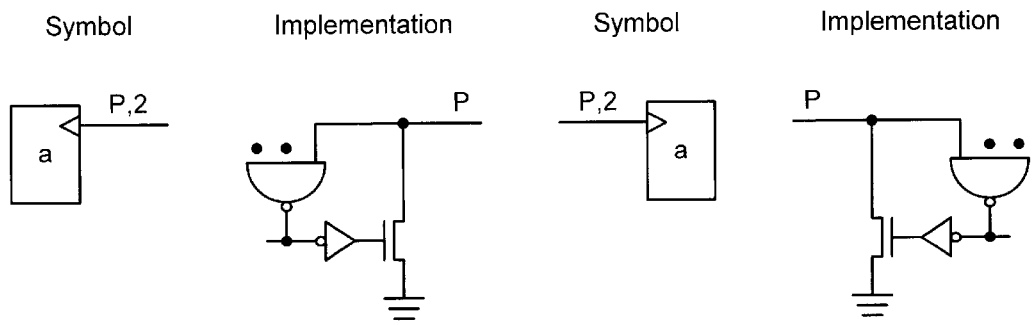
FIG. 7A illustrates a type of terminal connection for a GasP module with a time separation of two gate delays between firings of modules in accordance with an embodiment of the present invention.
Figure 7B:
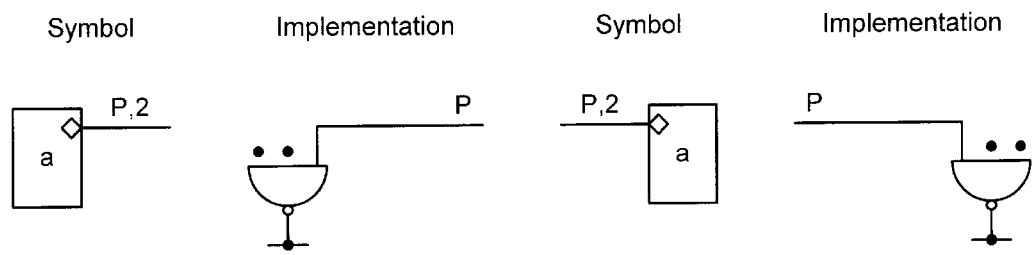
FIG. 7B illustrates another type of terminal connection for a GasP module with a time separation of two gate delays between firings of modules in accordance with an embodiment of the present invention.
Figure 7C:
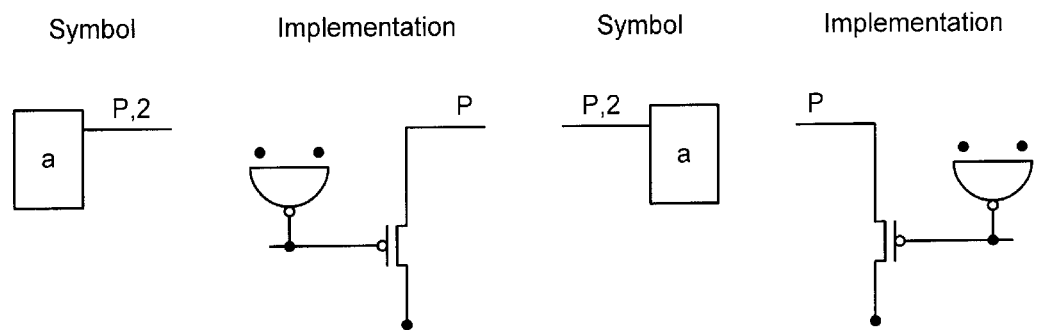
FIG. 7C illustrates yet another type of terminal connection for a GasP module with a time separation of two gate delays between firings of modules in accordance with an embodiment of the present invention.
Figure 8A:
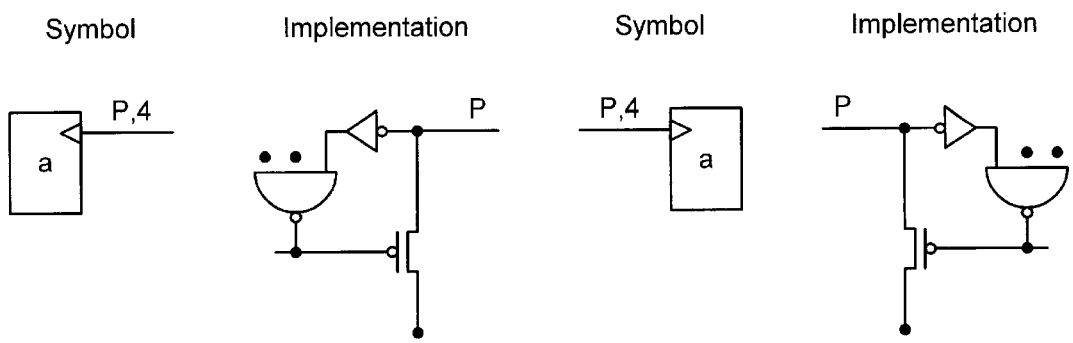
FIG. 8A illustrates a type of terminal connection for a GasP module with a time separation of four gate delays between firings of modules in accordance with an embodiment of the present invention.
Figure 8B:
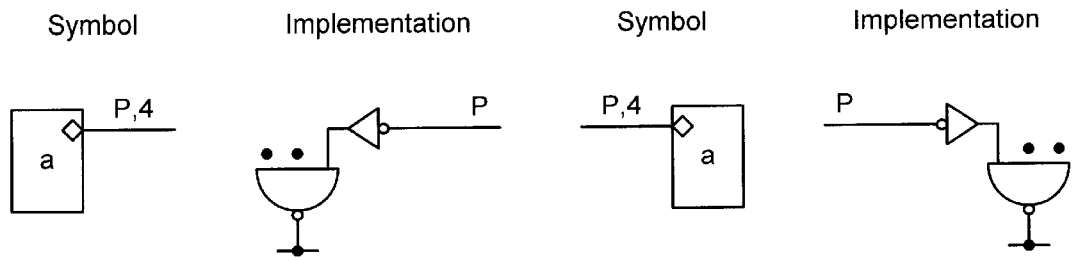
FIG. 8B illustrates another type of terminal connection for a GasP module with a time separation of four gate delays between firings of modules in accordance with an embodiment of the present invention.
Figure 8C:
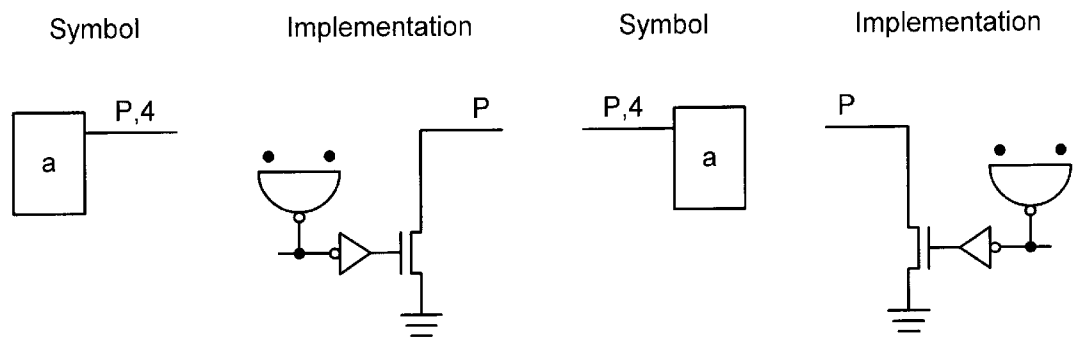
FIG. 8C illustrates yet another type of terminal connection for a GasP module with a time separation of four gate delays between firings of modules in accordance with an embodiment of the present invention.

FIG. 7A shows a GasP module with a so-called self-resetting input. FIG. 7B shows a GasP module with a so-called non-resetting input. FIG. 7C shows a GasP module with an output. Common in all GasP module implementations is a NAND gate. To complete the GasP Module implementation, circuitry is added to the NAND gate for each connection. When all inputs of a GasP module are set, which means HI in the implementations of FIGS. 7A and 7B, the NAND gate will eventually "fire," i.e., go LO. The firing of the NAND gate defines the occurrence of the event. After the NAND gate fires, a pull-down transistor resets each self-resetting input. The non-resetting input has no reset capability. When the NAND gate fires, the pull-up transistor sets the output.

FIG. 8 illustrates the same ideas as in FIG. 7, except that now "setting" and "resetting" are implemented differently. Here, an input is set when the input is LO. Thus, resetting an input happens by means of a pull-up transistor, and setting an output happens by means of a pull-down transistor.

Each connection is implemented as a tri-state wire with a keeper. A tri-state wire is a wire that is either "driven HI", "driven LO", or "not driven." To avoid clutter, connections in schematics appear as lines between GasP modules, and keepers are not shown. When a connection is driven HI or LO, the connection will be driven for a short period only, a period that is long enough to set the keeper and wire HI or LO. The keeper will then keep the state of the connection when the wire is not driven. Using the GasP implementations of FIGS. 7 and 8, the period that a wire is driven is about three gate delays. Notice that each pull-down or pull-up transistor conducts for a period of about three gate delays.

In order for these implementations to work properly, all transistors must be properly sized. Here, this means that all gates must have the same step-up ratio, i.e., the ratio between each gate's drive strength and output load is the same. When properly sized, each gate has about the same delay, and thus we can justifiably speak about units of delay between any two events.

Figure 9A:
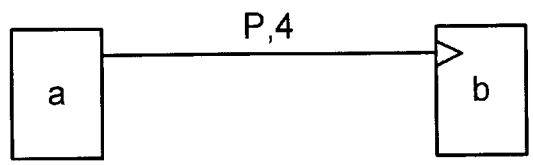
FIG. 9A is a symbolic representation of a connection between GasP modules with a delay of four units between two events in accordance with an embodiment of the present invention.
Figure 9B:
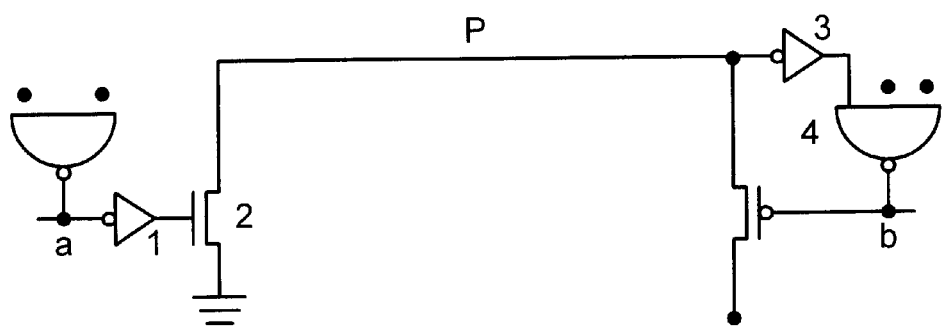
FIG. 9B illustrates corresponding circuitry for a connection between GasP modules with a delay of four units between two events in accordance with an embodiment of the present invention.
Figure 9C:
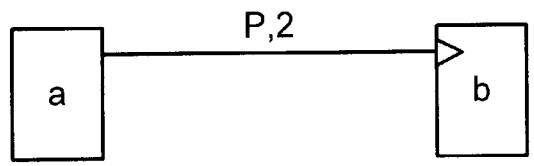
FIG. 9C is a symbolic representation of a connection between GasP modules with a delay of two units between two events in accordance with an embodiment of the present invention.
Figure 9D:
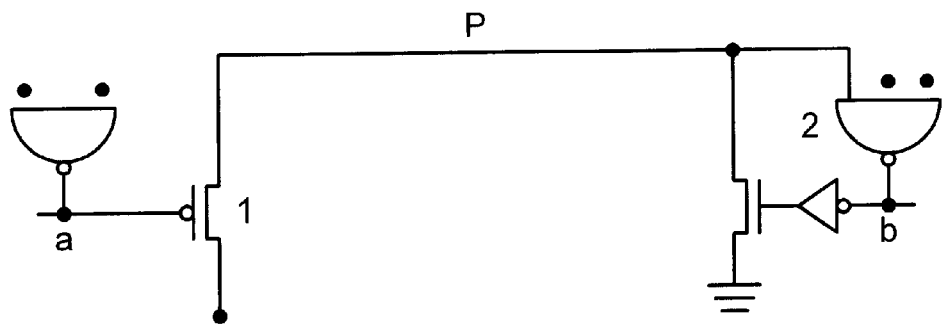
FIG. 9D illustrates corresponding circuitry for a connection between GasP modules with a delay of two units between two events in accordance with an embodiment of the present invention.

The label P on the connections to the GasP modules in FIGS. 7 and 8 gives a name to the connections and is often associated with the name of the state to which the connection corresponds. The labels 2 and 4 indicate whether the implementation of the connection must realize a time separation of two or four gate delays, respectively, between firings of successive GasP modules. FIG. 9 illustrates this idea. FIG. 9A shows a simple connection between GasP modules and FIG. 9B shows its implementation. The label 4 indicates that the connection must realize time separation of four gate delays between the firings of modules a and b. Notice that between node a going LO and node b going LO in FIG. 9B there are four gate delays. Similar remarks can be made for FIGS. 9C and 9D, where the label 2 denotes a time separation of two gate delays. The labels 2 and 4 will come in handy later when we want to calculate cycle times in GasP networks.

In an implementation we indicate the initial state of each connection by darkening the arrowheads or diamonds inside the modules that are associated with the connection. A connection with a darkened arrowhead or diamond is initially set, that is, the connection is initialized HI when the connection has the label 2 and initialized LO when the connection has the label 4.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A domino logic circuit that operates asynchronously, comprising:
    a pipeline comprised of a number of stages containing domino logic, including a present stage that receives one or more inputs from a prior stage and that generates one or more outputs for a next stage; and
    a control circuit for the present stage that is configured to ensure that the present stage enters a precharging state before entering an evaluation state in which one or more inputs of the present stage are used to generate one or more outputs;
    wherein the control circuit receives a prior control signal from the prior stage and sends a present control signal to the next stage; and
    wherein the control circuit for the present stage is configured so that a minimum cycle time between successive evaluation states is six gate delays.

2. The domino logic circuit of claim 1,
    wherein the prior control signal indicates that the prior stage is in the evaluation state; and
    wherein upon receiving the prior control signal, the control circuit for the present stage is configured to,
        cause the domino logic within the present stage to enter the evaluation state so that the domino logic evaluates at least one input received from the prior stage to produce at least one output for the next stage, and to
        cause the domino logic within the prior stage to return to the precharging state, whereby the domino logic within the prior stage precharges before entering a subsequent evaluation state.

3. The domino logic circuit of claim 1, wherein the control circuit for the present stage includes a GasP module;
    wherein the GasP module fires when inputs to the GasP module are set;
    wherein the GasP module firing causes outputs of the GasP module to be set and causes inputs to the GasP module to be reset.

4. The domino logic circuit of claim 1,
    wherein the control circuit for the present stage feeds an evaluation signal into domino logic in the present stage, which causes the domino logic in the present stage to enter the evaluation state;
    wherein the control circuit for the present stage feeds a precharging signal into the present stage, which causes the domino logic in the present stage to enter the precharging state; and
    wherein if the evaluation signal and the precharging signal are not asserted, the domino logic in the present stage enters a hold state in which the outputs of the domino logic do not change.

5. The domino logic circuit of claim 4, wherein the control circuit for the present stage includes:
    a first GasP module that generates the evaluation signal for the present stage; and
    a second GasP module that generates the precharging signal for the present stage;
    wherein the first GasP module receives an input from the second GasP module and an input from the control circuit for the prior stage;
    wherein the second GasP module receives an input from the control circuit for the next stage.

6. The domino logic circuit of claim 4,
    wherein the control circuit for the present stage includes a GasP module that generates the evaluation signal for the present stage; and
    wherein the precharging signal for the present stage is generated from the evaluation signal for the next stage.

7. The domino logic circuit of claim 1, further comprising a keeper circuit that is configured to maintain an existing value on an output of the present stage.

8. The domino logic circuit of claim 1, wherein domino logic circuitry for the present stage includes:
    a pulldown transistor for pulling an internal node of the present stage to a low voltage during the evaluation state; and
    a pullup transistor for pulling the internal node of the present stage to a precharge voltage during the precharging state.

9. A domino logic circuit that operates asynchronously, comprising:
    a pipeline comprised of a number of stages containing domino logic, including a present stage that receives one or more inputs from a prior stage and that generates one or more outputs for a next stage; and
    a control circuit for the present stage that is configured to ensure that the present stage enters a precharging state before entering an evaluation state in which one or more inputs of the present stage are used to generate one or more outputs;
    wherein the control circuit receives a prior control signal from the prior stage and sends a present control signal to the next stage;
    wherein the control circuit for the present stage is configured so that a minimum cycle time between successive evaluation states is six gate delays;
    wherein the control circuit for the present stage feeds an evaluation signal into domino logic in the present stage, which causes the domino logic in the present stage to enter the evaluation state;

wherein the control circuit for the present stage feeds a precharging signal into the present stage, which causes the domino logic in the present stage to enter the precharging state; and wherein if the evaluation signal and the precharging signal are not asserted, the domino logic in the present stage enters a hold state in which the outputs of the domino logic do not change.

10. The domino logic circuit of claim 9, wherein the prior control signal indicates that the prior stage is in the evaluation state; and wherein upon receiving the prior control signal, the control circuit for the present stage is configured to, cause domino logic within the present stage to enter the evaluation state, so that the domino logic within the present stage evaluates at least one input received from the prior stage to produce at least one output for the next stage, and to cause the domino logic within the prior stage to return to the precharging state, whereby the domino logic within the prior stage precharges before entering a subsequent evaluation state.

11. The domino logic circuit of claim 9, wherein the control circuit for the present stage includes a GasP module;

wherein the GasP module fires when inputs to the GasP module are set;

wherein the GasP module firing causes outputs of the GasP module to be set and causes inputs to the GasP module to be reset.

12. The domino logic circuit of claim 9, wherein the control circuit for the present stage includes:

a first GasP module that generates the evaluation signal for the present stage; and a second GasP module that generates the precharging signal for the present stage;

wherein the first GasP module receives an input from the second GasP module and an input from the control circuit for the prior stage;

wherein the second GasP module receives an input from the control circuit for the next stage.

13. The domino logic circuit of claim 9, wherein the control circuit for the present stage includes a GasP module that generates the evaluation signal for the present stage; and wherein the precharging signal for the present stage is generated from the evaluation signal for the next stage.

14. The domino logic circuit of claim 9, further comprising a keeper circuit that is configured to maintain an existing value on an output of the present stage.

15. The domino logic circuit of claim 9, wherein domino logic circuitry for the present stage includes:

a pulldown transistor for pulling an internal node of the present stage to a low voltage during the evaluation state; and a pullup transistor for pulling the internal node of the present stage to a precharge voltage during the precharging state.

16. A computer system including domino logic circuitry that operates asynchronously, comprising:

a processor;

a main memory;

a pipeline comprised of a number of stages containing domino logic, including a present stage that receives one or more inputs from a prior stage and that generates one or more outputs for a next stage; and a control circuit for the present stage that is configured to ensure that the present stage enters a precharging state before entering an evaluation state in which one or more inputs of the present stage are used to generate one or more outputs;

wherein the control circuit receives a prior control signal from the prior stage and sends a present control signal to the next stage; and wherein the control circuit for the present stage is configured so that a minimum cycle time between successive evaluation states is six gate delays.

17. A method for asynchronously controlling a number of stages of domino logic gates, comprising:

receiving a prior control signal from a prior stage indicating that the prior stage is in an evaluation state in which the prior stage generates at least one output for a present stage; and in response to the prior control signal, causing domino logic within the present stage to enter the evaluation state, so that domino logic within the present stage evaluates at least one input received from the prior stage to produce at least one output for a next stage, and causing the prior stage returns to a precharging state, whereby the domino logic within the prior stage precharges before entering a subsequent evaluation state;

wherein a minimum cycle time between successive evaluation states is six gate delays.

18. The method of claim 17, wherein when the present stage enters a precharging state, the method further comprises using a keeper circuit to maintain an existing value on an output from the present stage to the next stage.

19. The method of claim 17, wherein a control circuit for the present stage is implemented using at least one GasP module;

wherein the GasP module fires when inputs to the GasP module are set; and wherein the GasP module firing causes outputs of the GasP module to be set and causes inputs to the GasP module to be reset.

20. The method of claim 19, wherein the control circuit for the present stage includes:

a first GasP module that generates an evaluation signal for the present stage; and a second GasP module that generates an precharging signal for the present stage;

wherein the first GasP module receives an input from the second GasP module and an input from the control circuit for the prior stage;

wherein the second GasP module receives an input from the control circuit for the next stage.

21. The method of claim 19, wherein the control circuit for the present stage includes a GasP module that generates an evaluation signal for the present stage; and wherein a precharging signal for the present stage is generated from the evaluation signal for the next stage.

* * * * *